(12) United States Patent
Birurakis et al.

(10) Patent No.: US 9,989,589 B2
(45) Date of Patent: Jun. 5, 2018

(54) COMPUTER SYSTEM FOR AUTOMATIC TEST EQUIPMENT (ATE) USING ONE OR MORE DEDICATED PROCESSING CORES FOR ATE FUNCTIONS

(71) Applicants: William Birurakis, Great Mills, MD (US); Valeriy Pavlenko, Leesburg, VA (US)

(72) Inventors: William Birurakis, Great Mills, MD (US); Valeriy Pavlenko, Leesburg, VA (US)

(*) Notice: Subject to any disclaimer, the term of this patent is extended or adjusted under 35 U.S.C. 154(b) by 20 days.

(21) Appl. No.: 15/081,083

(22) Filed: Mar. 25, 2016

(65) Prior Publication Data

US 2017/0276725 A1  Sep. 28, 2017

(51) Int. Cl.
| | |
|---|---|
| *G01R 31/317* | (2006.01) |
| *G01R 31/28* | (2006.01) |
| *G06F 11/273* | (2006.01) |
| *G06F 11/263* | (2006.01) |
| *G06F 11/22* | (2006.01) |

(52) U.S. Cl.
CPC ... *G01R 31/31724* (2013.01); *G01R 31/2834* (2013.01); *G06F 11/273* (2013.01); *G01R 31/31723* (2013.01); *G06F 11/2242* (2013.01); *G06F 11/263* (2013.01)

(58) Field of Classification Search
CPC .......................... G01R 31/2834; G06F 11/26
See application file for complete search history.

(56) References Cited

U.S. PATENT DOCUMENTS

| | | | |
|---|---|---|---|
| 2007/0220456 A1* | 9/2007 | Duan | G01R 31/31723 716/136 |
| 2010/0262879 A1* | 10/2010 | Floyd | G01R 31/31724 714/733 |
| 2011/0302560 A1* | 12/2011 | Nadbath | G06F 11/263 717/128 |
| 2016/0224452 A1* | 8/2016 | Park | G06F 11/2242 |
| 2016/0378697 A1* | 12/2016 | Jayakumar | G06F 13/24 710/261 |

* cited by examiner

*Primary Examiner* — Ajay Ojha
(74) *Attorney, Agent, or Firm* — Clark A. Puntigam; Jensen & Puntigam, P.S.

(57) ABSTRACT

A system and method for testing electronic circuit devices. The system has a central processing unit with a plurality of separate core processing units. The utility service program is initiated at the startup of the computer program which acts as an intermediary between user applications and the computer operating system. The utility service is responsive to an ATE execution engine to set an affinity for one or more processing cores for exclusive use for the ATE execution engine. The ATE execution engine communicates with the utility service to reserve one or more processing cores for execution of the program for testing electronic devices.

14 Claims, 11 Drawing Sheets

COMPUTER SYSTEM FOR AUTOMATIC TEST EQUIPMENT (ATE) USING ONE OR MORE DEDICATED PROCESSING CORES FOR ATE FUNCTIONS

TECHNICAL FIELD

The present invention relates generally to the field of Automated Test Equipment (ATE) systems, particularly to ATE Test Executive software for organizing and executing test sequences and more specifically to the parallel execution in the time domain of said test sequences or test programs, and to a system and method for the use of one or more dedicated processing cores in a multi-core central processing unit to maintain time coherence of software operations and signal relationships of ATE test programs.

BACKGROUND OF THE INVENTION

As ATE test sequences become more complex and the requirements for testing units under test (UUTs) such as circuits, circuit cards, and electronic sub-systems, require more complex and finite synchronization of signals (stimulus and acquisition), ATE systems must have the ability to stimulate and measure multiple signals maintaining the temporal relationships of the signals. A typical conventional multi-core CPU which consists of two or more processors put together on a single die which shares the same interconnect to the rest of the system is called a multi-core CPU. The CPU is the heart of the computer motherboard.

Modern desktop operating systems (OS) feature multitasking operations. Multitasking operating systems allow for the concurrent execution of computer instructions. A common example is allowing a user to enter information while, perceptually at the same time, performing a data communication process to send or retrieve additional data. Multitasking achieves concurrency by performing multiple tasks over a defined time period.

Multitasking does not imply parallel execution. Each core of a multi-core central processing unit (CPU) can execute one computer instruction at a time. In a multi-core system, multiple computer instructions can be executed in parallel. Nevertheless there is no guarantee that any given instruction will have an available core at the needed time nor execute in parallel to another specific instruction.

The perception of parallel computer instruction execution occurs when the central processing unit context switches rapidly and when no individual instruction or discrete set of instructions requires more than the minimum of CPU time.

When software requests a computer instruction be performed, the responsibility for assigning the instruction to a core for execution is given to the operating system and CPU embedded firmware. The operating system assigns a priority based on criteria not necessarily consistent with the desired purpose of the requesting application. The time between when an instruction request is made by software and the moment when the instruction is performed on a core is nondeterministic. The variability of when the instruction is performed is arbitrary and presents a predicament to ATE system test program execution as the arbitrary nature of the instruction execution prevents the software from maintaining temporal relationships between the multiple computer instructions.

In modern multi-thread enabled operating systems, a thread in a process can migrate from one processor core to another processor core, with each migration reloading the processor cache. Under heavy system loads, specifying which processor should run a specific thread can improve performance by reducing the number of times the processor cache is reloaded. The association between a processor and a thread is called the processor affinity.

Synchronization of computer instructions is a common problem within parallel software execution and is a major factor preventing ATE systems from having the ability to stimulate and measure multiple signals while maintaining the temporal relationships of the signals. Therefore, it is desired to have a system in which computer instructions have improved temporal alignment. It is desired that synchronization of tasks performed in parallel be maintained as configured by the user and be consistent across multiple executions of a test program. Further, it is desired to abstract the implementation details of temporal alignment and synchronization from the user such that the user need not have specific knowledge of the underlying computer and OS architectures.

Prior art software ATE Test Executives can perform tests in parallel but fail to achieve the synchronicity of operations across a coherent time-domain set of instrument operations. Without the ability to synchronize instrument operations, temporal information cannot be extracted when comparing signals generated or acquired by parallel instrument operations. This invention relates specifically to the method and process of maintaining temporal alignment of ATE tasks by a test executive and maintaining the temporal alignment of instrument actions leading to temporal coherence of signals.

SUMMARY OF THE INVENTION

Accordingly the present invention comprises an automatic test equipment (ATE) computer system for testing electronic circuit devices, comprising: a central processing unit having a plurality of separate core processing units; a utility service program initiated at the start up of the computer system which acts as an intermediary between user applications and an operating system of the computer system, wherein the utility service is responsive to an ATE execution engine to set an affinity for one or more processing cores for exclusive use of the ATE execution engine in the central processing unit; and an ATE execution engine for communicating with the utility service program to reserve one or more processing cores for execution of a test program for electronic devices, using the reserved core or cores, wherein the ATE test program is executed on the reserved core or cores synchronously, apart from other computer operations which operate on remaining cores.

The invention also includes a computer based method for operating automatic test equipment for electronic devices under test, comprising the steps of: initiating the operation of a utility service which acts as an intermediary between user applications and an operating system of the computer system; reserving at least one core processing unit for the exclusive use of a test execution engine, such that the selected core is masked in the computer operating system; and testing electronic devices with the automatic test equipment using the reserved core.

BEST MODE FOR CARRYING OUT THE INVENTION

The following comprises a glossary of nomenclature used herein:

Automated Test Equipment—(ATE) an apparatus that performs tests on a device, such as circuits, circuit cards, automated subsystems and the like, using automation to quickly perform stimuli and acquisitions and evaluate the results of said stimuli and acquisitions. The use of ATE includes reference to Automated Test System (ATS) and other names for like systems that perform similar testing processes.

ATE Test Executive—Software that operates as the overall manager of component systems in an ATE. More specifically, the test executive enables the creation and configuration of test programs as well as controls the execution of said test programs.

ATE Execution Engine—The specific component or capability of an ATE Test Executive that executes predefined test programs.

Run-Time—Mode of an ATE Test Executive during which a Test Program is executing operations, often under the direction of an ATE Execution Engine.

Test Sequence—A series of operations that the user specifies for execution.

Instrument Operation—The logical instrument action, which may be a combination of physical instrument actions. That is, an operation may describe multiple actions which are performed together to accomplish a task.

Test Group—A test group consists of one or more test sequences.

Test Program—A set or collection of test groups.

Unit Under Test (UUT)—A device or component that is being tested such as a circuit card or assembly of electronic components. Sometimes also referred to as Device Under Test (DUT) or Equipment Under Test (EUT).

Service—a computer program that operates in the background conforming to specific interface rules and protocols of the operating system.

Several illustrative embodiments of the invention are described below. It will be recognized that in the manifestation of any such actual embodiment, application-specific conclusions based on developer specific goals such as those pertaining to system-related constructs and constraints, may vary from one implementation to another. While such a development effort might be complex and time-consuming, it would nevertheless be a routine undertaking for those of skill in the art having the benefit of this disclosure.

The word "exemplary" is used herein to mean "serving as an example, instance, or illustration". Any embodiment described herein as "exemplary" is not necessarily to be construed as preferred or advantageous over other embodiments. Those of skill in the art will recognize other embodiments may be utilized, and other changes may be made, without departing from the spirit or scope of the subject matter presented herein. Furthermore, the claimed subject matter may be implemented as a method, system, or article of manufacture using standard programming and/or engineering techniques to produce software, firmware, hardware, or any combination thereof to control a computer to implement the disclosed subject matter. The term "article of manufacture" as used herein is intended to encompass a computer program accessible from any non-transitory computer-readable device, or media.

The illustrative embodiments described in the detailed description, drawings, and claims are not meant to be limiting. Other embodiments may be utilized, and other changes may be made, without departing from the spirit or scope of the subject matter presented here.

Embodiments of the present invention generally provide for coherent temporal alignment of ATE stimuli and/or acquisition signals and data.

For precise stimulus and acquisition, ATE systems performing parallel instrument operations require said operations to occur temporally aligned within a coherent time domain.

The embodiments described herein show an arrangement that efficiently solves this problem.

Figure 1:
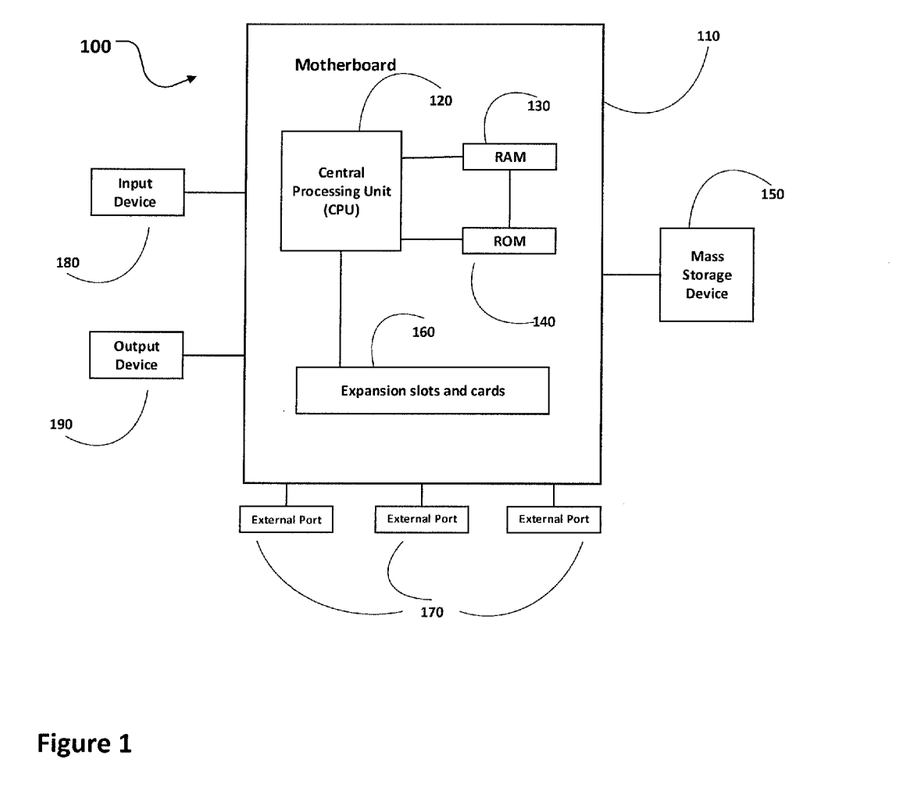
FIG. 1 is a diagram exemplary of multi core mother boards.

With reference to FIG. 1, a block diagram of an exemplary computer system 100 is illustrated. In various embodiments the computer system 100 may be a personal computer, server, a mainframe, embedded computer system, or the like. The computer system includes a main structure 110 which may be a computer motherboard, a desktop computer enclosure and/or tower, a server enclosure, or the like. In one embodiment the main structure 110 includes a multi-core CPU 120 that in this example incorporates a multi-core structure consisting of at least two cores, a first core (hereinafter referred to as "Core-0"), a second core (hereinafter designated as "Core-1"), and subsequent cores if present designated sequentially as "Core-2", "Core-3", through "Core-n", all being located on a single die.

The heart of the computer motherboard is the aforementioned CPU 120. Data transfer occurs between each core of the CPU 120 and other components such as RAM 130, ROM 140, mass storage devices 150, expansion slots 160, external ports 170, input devices 180, and output devices 190 using several busses on the motherboard, not herein specifically identified as these would be apparent to one of ordinary skill in the art, at data rates specific to the busses used. The motherboard 110 and the elements thereof described so far are the same as in any conventional multi-core system.

The principle of the invention and the improvement offered by the invention may be understood with reference to a standard multi-threaded program initiation sequence and program execution paradigm which will now be described.

Figure 2:
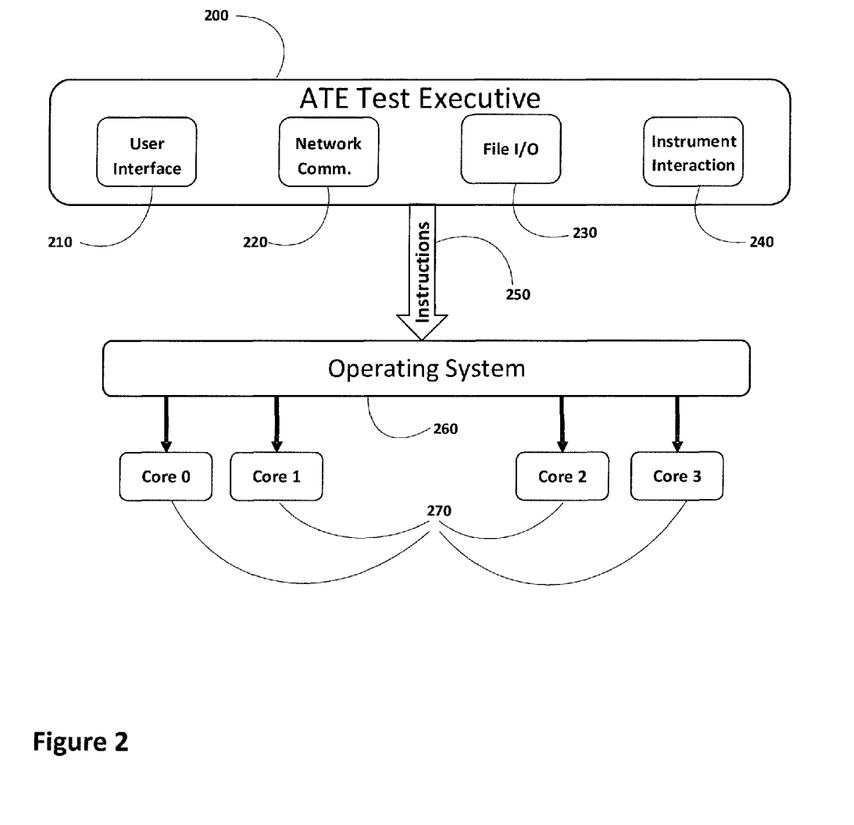
FIG. 2 is a diagram of a known multithreaded computer application.

A computer program consists of multiple computer instructions. The execution of each computer instruction occurs in a processing core in the computer. In a multi-core CPU 120 environment, the operating system 260 can select any one of the CPU cores, e.g., Core-0, Core-1, through Core-n, as the core on which any given computer instruction will execute. FIG. 2 depicts exemplary software modules such as user interface 210, network communications 220, file input and output (I/O) 230, and instrument interaction 240 of an ATE test executive 200 and their interaction 250 and execution in a multithreaded computer system with multiple instructions. In this arrangement, computer operations are managed by the operating system 260 and are routed to individual cores 270 for execution. In this arrangement, operating system 260 determines priority, assignment, and management of each computer operation.

Figure 3:
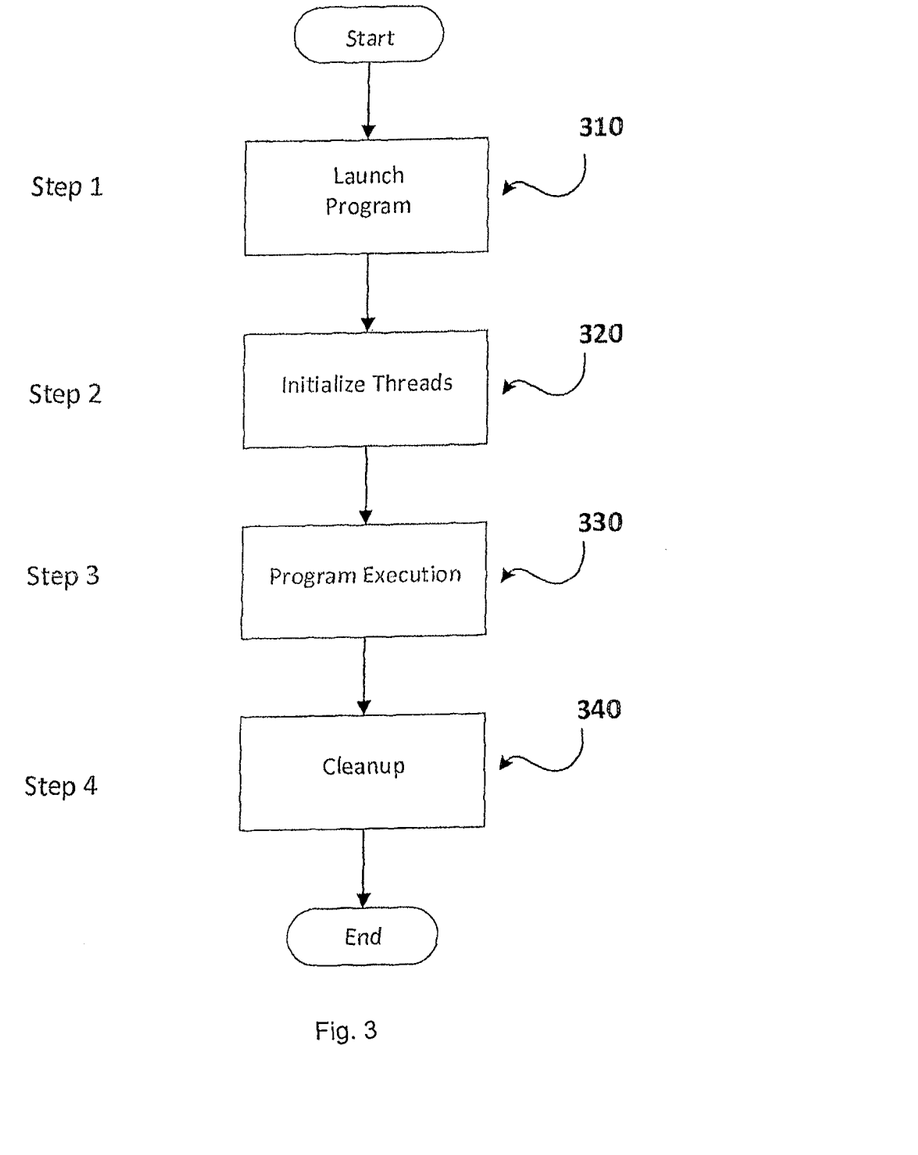
FIG. 3 is a flow chart of a known multi-threaded program launch process.

FIG. 3 shows how individual threads of the aforementioned multi-threaded program are physically initiated within a multi-core CPU system. After a user double-clicks on a program icon or selects the program from a menu (FIG. 3, Step 1, 310), the program begins execution. The main program will initialize (FIG. 3, Step 2, 320) as many individual threads as the programmer deems necessary for optimal program execution (FIG. 3, Step 3, 330). During program thread execution, the OS and CPU 120 embedded firmware will assign the specific program instruction to a core for execution. At the end of program execution, there is a general cleanup (FIG. 3, Step 4, 340) process.

Figure 4:
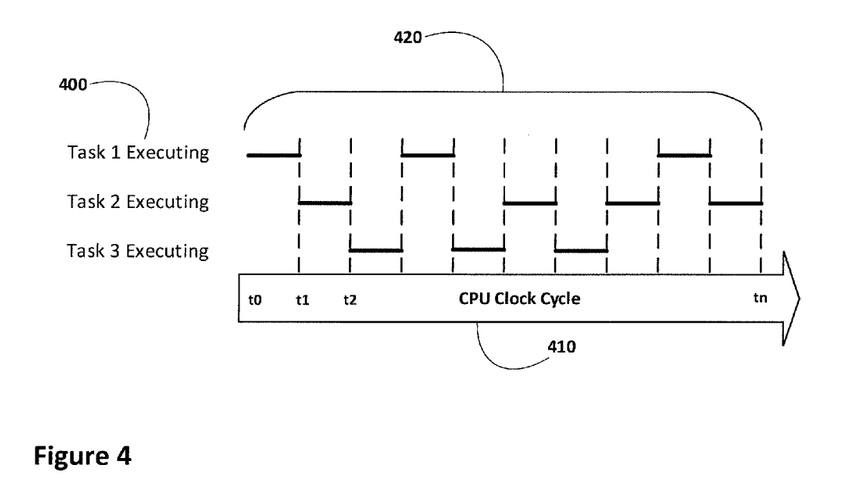
FIG. 4 is a diagram showing how a CPU conventionally multitasks between threads on a single core.

FIG. 4 is an exemplary view of a multitasking program execution. The computer instructions of each task 400 execute asynchronously across CPU clock cycles (t0, t1, through tn) 410 in a threaded sequence 420 in a single core CPU. In this arrangement, the operating system assigns priority for execution of each task and the order of thread operations is not controlled by the application program. In the threaded sequence 420, the order of tasks executing 400 is determined by the operating system 260. The execution order of tasks is often non-sequential and is therefore not distributed time coherently by CPU Clock Cycle 410. This arrangement is exemplary of a series of asynchronous operations.

The following description will relate to distinguishing features of the present invention.

Figure 9:
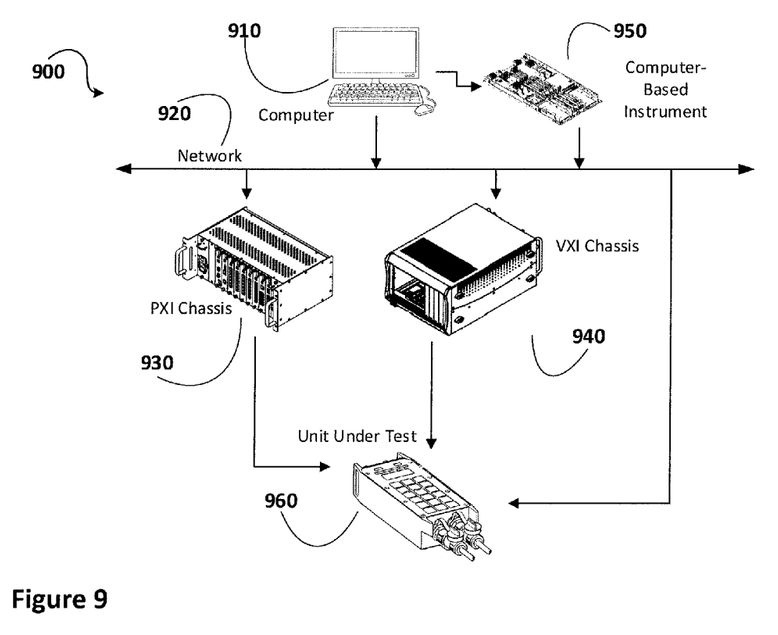
FIG. 9 is a diagram of an ATE system including instruments and UUT.

FIG. 9 illustrates an exemplary ATE system 900. The system 900 comprises a host computer 910 which connects to one or more instrument sub-systems 930, 940, 950. The host computer comprises a CPU, memory, display screen, and input devices such as keyboard and mouse. The host computer 910 may connect through the one or more instrument sub-systems 930, 940, 950 to simulate, measure, and analyze a unit under test (UUT) 960. Instruments may be one or more of a plurality of instruments connected via PXI 930, VXI 940, or other 950 interfaces as recognized by those skilled in the art. The computer system 900 includes memory and/or storage media on which one or more computer programs according to the present invention are stored. These computer programs are commonly referred to as test executives and are used to configure and execute test programs.

According to the invention, one or more of the cores, as shown in the exemplary embodiment (FIG. 5) as 510 of the multi-core CPU 500 on a single die, is dedicated to a specific function of the improved ATE application. The ATE execution engine refers to a conventional ATE (automatic test equipment) using stimulus signals directed to a unit under test, receiving response signals and analyzing those signals to determine faults. Many ATE arrangement are well known and hence not described in detail here. They typically involve physical contact with wire connections from the ATE through a connecting device to cabling or wires to the unit under test (UTT). Further, using FIG. 2 as a base reference and contrasting the embodiment of FIG. 6, the ATE test executive 600 is comprised of the same exemplary modules as those in FIG. 2 such as user interface 610, network communications 620, File I/O 630, and instrument interaction 640 with the same interaction 650 with the operating system 660. The embodiment of the invention differs in how each of the cores 670 and 680 are used. The cores used by the operating system 660 for user interface (mouse, keyboard, and display), execution of anti-virus processes, network communication 620, file I/O 630, and other necessary system functions, are restricted to using the common use cores 680. All instrument interaction 640 occurs on the one or more dedicated cores 670. This ensures that all instrument operations are managed in the time domain enforcing coherent alignment of signals (stimulus and acquisition) during test execution.

Those of skill in the art recognize many ATE systems often restrict or limit the user in regards to permissions for accessing system level capabilities on the computer system, specifically low level native operating system capabilities such as CPU core reservation. One approach to solve this limitation is to create a service to act as an intermediary between the user application and the operating system thus abstracting the need for elevated permissions from the user application.

Figure 7:
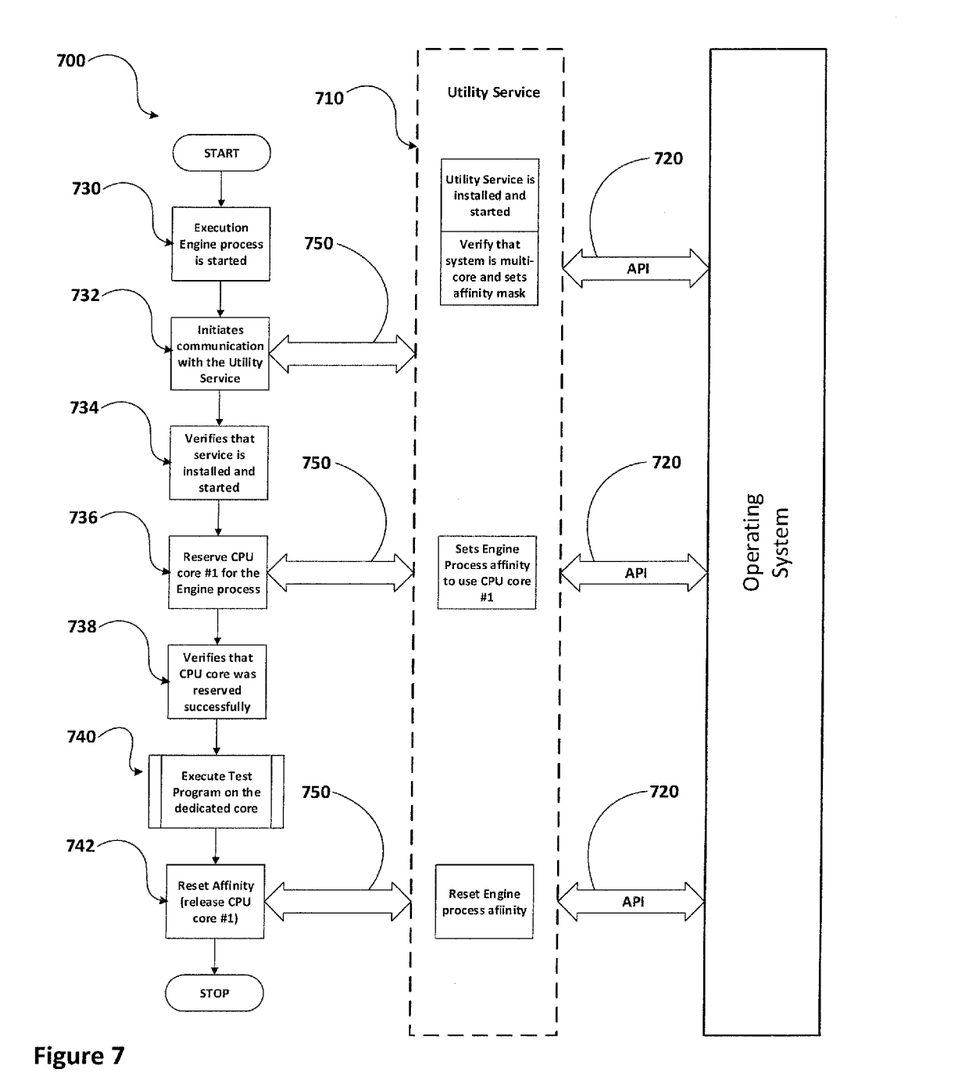
FIG. 7 is a flow chart that shows the ATE Execution Engine Initialization sequence and its interaction with the utility service in the system of the present invention.

The Utility Service 710 is an embodiment of a service application that enables said abstraction. The utility service is started by the operating system upon initial boot of the computer system, operates in the background with sufficient privileges to perform native operating system methods 720, and continues to execute as long as the operating system is running or until manually disabled by the user.

Figure 5:
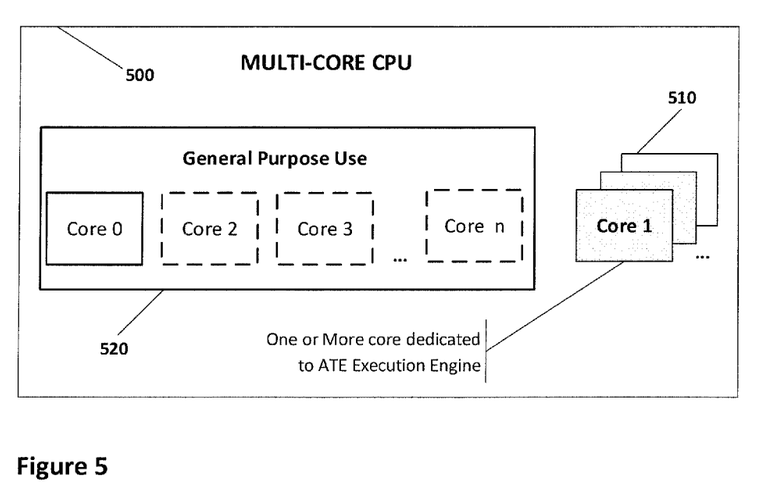
FIG. 5 is a diagram showing an ATE execution engine on a multi-core CPU of the present invention.
Figure 6:
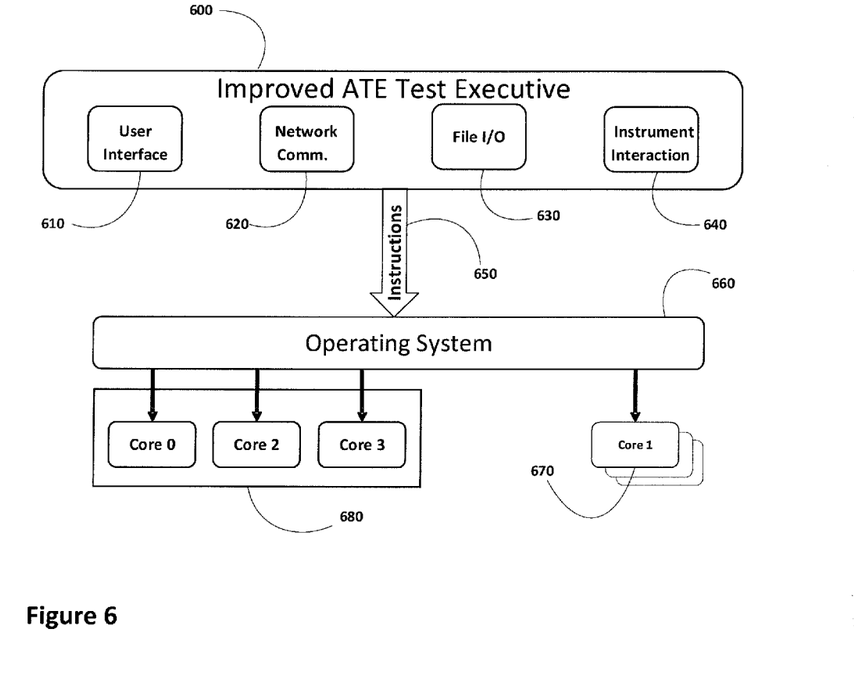
FIG. 6 is a diagram of an ATE application of the present invention using one or more dedicated CPU cores.

The utility service 710 uses native operating system APIs 720 to interact with the operating system to verify that the environment is a multi-core system and to retrieve the system affinity mask. The retrieved system mask is used to set the affinity mask for one or more cores on a multi-core CPU 500 that will be reserved for the ATE execution engine process and the affinity mask for all other CPU cores 520 for general use. In one embodiment, FIG. 5 depicts one embodiment whereby 510 is the reserved one or more cores on the multi-core CPU 500.

Consider in more detail the steps of FIG. 3 with reference to those depicted in FIG. 7, which is a more detailed flowchart of the embodiment of the program initiation process and is an exemplary method of the system described herein.

The ATE test executive application will start a separate process for the ATE execution engine 700. Once the execution engine process has been started 730, the engine initiates communication 732 with the utility service 710 using the service interface 750. The use of a service, the utility service 710 at run-time of a test program, is a novel approach for an ATE test executive for provisioning system level resources such as the CPU core affinity mask. From this initial communication, we confirm that the service is installed and running 734.

Before the ATE execution engine 700 begins execution of the test program steps, the engine will request reservation of one or more CPU cores 736 using the service interface 750. The engine uses the service to set the affinity of its own process. FIG. 5. Depicts one embodiment whereby 510 is the selected one or more cores of the multi-core CPU 500. The utility service 710 reserves said cores for the ATE execution engine using the proper operating system API 720 and verifies the reservation was successful 738.

Figure 10:
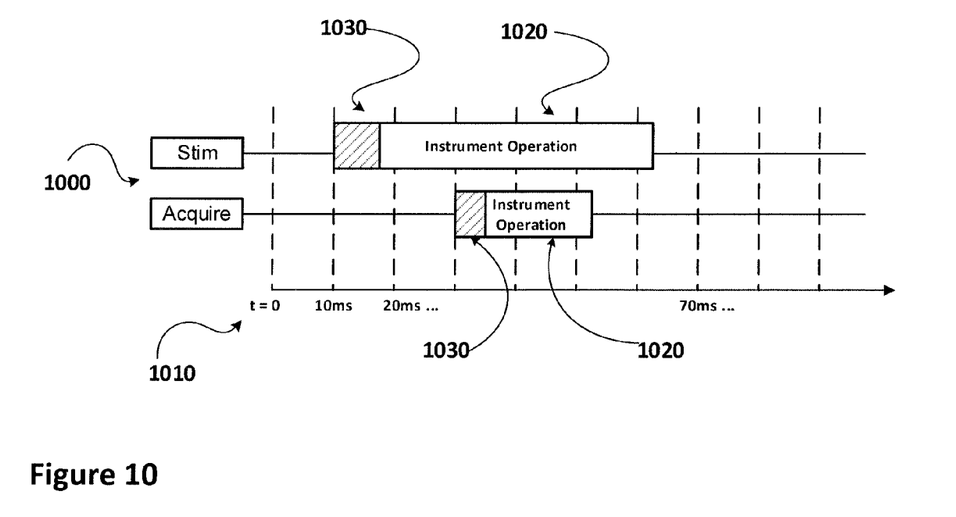
FIG. 10 is a diagram of non-deterministic timing showing variable timing delays.

The ATE execution engine now executes the test program 740 using the dedicated said cores. Without core reservation the execution of the instrument operations by the ATE execution engine would be managed by the CPU along with all other tasks, as illustrated in FIG. 4. The result for this type of execution would be asynchronous, non-deterministic timing where the start time of each instrument operation cannot be guaranteed to be exactly the configured value. FIG. 10 is an exemplary illustration of this consequence. Whether a stimulus or acquisition 1000 action, the instrument operation 1020 will have a variable latency in initiation 1030 and not be aligned to a deterministic time point 1010.

Figure 8:
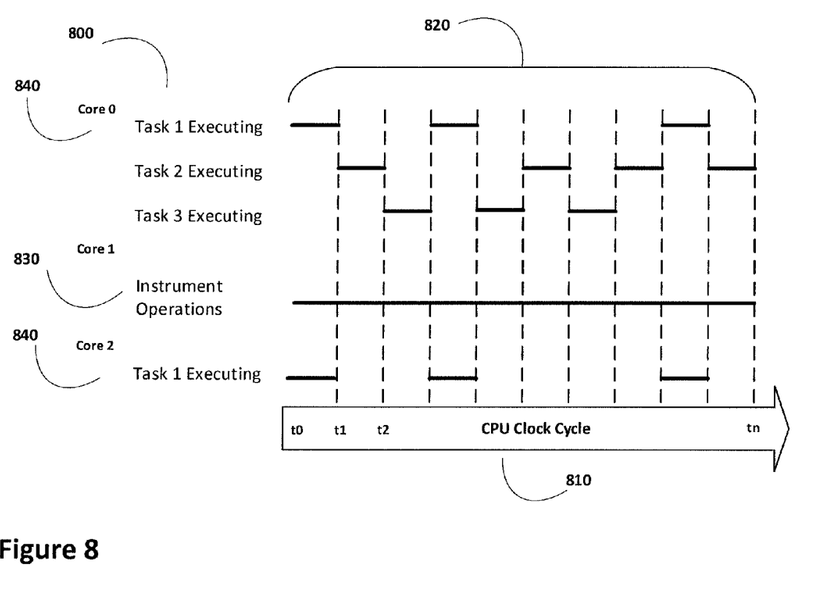
FIG. 8 is a diagram of temporal CPU core execution in a multi-core CPU with one or more dedicated cores of the present invention.

FIG. 8 is an exemplary view of instrument operations 830 being executed on a one or more dedicated cores 670 synchronously. All other tasks 840, managed by the CPU and sharing the remaining cores 680, execute asynchronously. The computer instructions of each task 840 execute across CPU clock cycles (t0, t1, through tn) 810 in a threaded sequence 820 with asynchronous non-deterministic timing. In contrast, the instrument operations that execute in the dedicated one or more cores 830 execute synchronously and maintain time coherence.

Figure 11:
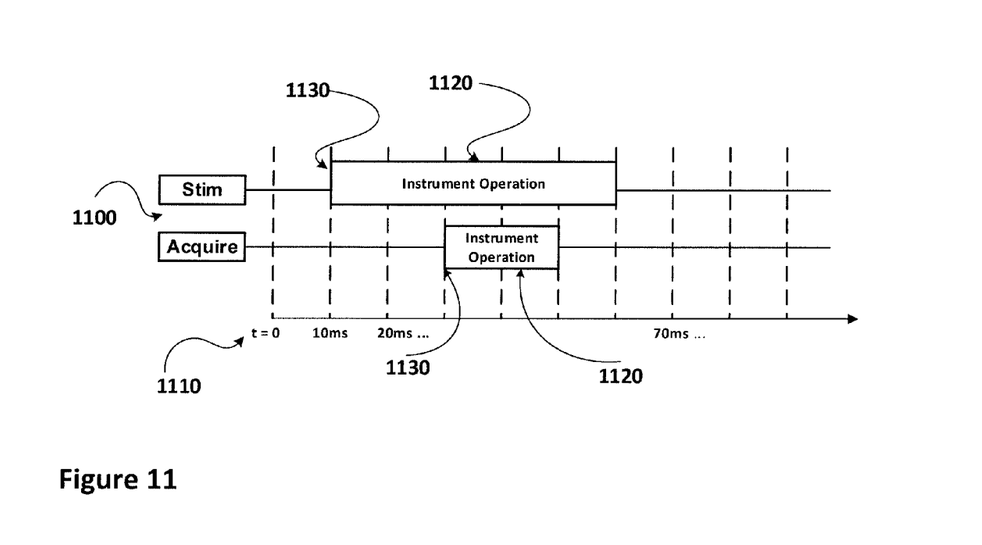
FIG. 11 is an exemplary view of deterministic timing on a reserved one or more cores showing 10 ms temporal alignment within the time domain of the present invention.

As a result of using one or more dedicated cores for the instrument operations, the instrument operations are executed synchronously with deterministic timing where the start time of each instrument operation is guaranteed to be exactly on the configured time interval. FIG. 11 is an exemplary illustration of deterministic temporal alignment that is achieved through the use of one or more dedicated cores for the execution of instrument operations. Whether a stimulus or acquisition 1100 action, the instrument operation 1120 is deterministically aligned temporally 1130 to a time interval 1110.

Once all steps of the test program have been executed, the ATE execution engine 700 will reset the affinity 742 of the reserved one or more cores via the utility service 710 using the service interface 750. This cleanup process releases the reserved one or more cores and allows the ATE system to utilize all cores in the computer until such time that the ATE execution engine 700 repeats the reservation process for a subsequent test program execution.

All of the previous discussions have shown that the invention can run instrument operations within an ATE application on one or more dedicated processor cores and achieve the coherent time domain temporal signal alignment. To accomplish this task, the invention reserves one or more dedicated cores of the multi-core CPU 500 where the instrument operations will execute. One exemplary embodiment is depicted as 510 in FIG. 5.

Thus it has been shown that the present invention provides a coherent time domain temporal aligned signal (stimulus and acquisition) capability on a multi-core CPU wherein one or more of the cores is isolated from other OS processes on the system and is used for the ATE test program engine. The invention reduces the cost of the ATE solution by reducing testing times and enabling improved analysis of UUT test results.

Although the invention has been described with reference to specific examples and drawings, it is understood that these examples and drawings should not be construed as limiting the application of the invention and that any changes and modifications are possible without departure from the scope of the attached patent claims.

Although a preferred embodiment of the invention has been disclosed for purposes of illustration, it should be understood that various changes, modifications and substitutions may be incorporated in the embodiment without departing from the spirit of the invention, which is defined by the claims which follow.

What is claimed is:

1. An automatic test equipment (ATE) computer system for testing electronic circuit devices located external to the ATE, the ATE comprising:
a central processing unit having a plurality of separate core processing units;
a utility service program initiated at the start up of the computer system which acts as an intermediary between user applications and an operating system of the computer system, wherein the utility service is responsive to an ATE execution engine in the ATE system to set an affinity for one or more processing cores for exclusive use of the ATE execution engine in the central processing unit, wherein testing of the external electronic circuit devices is accomplished by said one or more core processing units and wherein remaining core processing units from said plurality of separate core processing units are used for other computer operations; and
wherein the ATE execution engine communicates with the utility service program to reserve said one or more processing cores of the ATE computer system for execution of a test program present in the ATE for testing the externally located electronic devices, using the reserved core or cores, wherein the ATE test program is executed on the reserved core or cores synchronously, apart from other computer operations which operate on remaining cores.

2. The system of claim 1, wherein the external electronic circuit devices include electronic circuits, electronic circuit cards and electronic subsystems.

3. The computer system of claim 1, wherein the core or cores is masked in the computer operating system so that the reserved core or cores operate without any interference from the remaining cores.

4. The computer system of claim 1, including a test executive application which communicates with and verifies that the utility service is installed and running.

5. The computer system of claim 4, wherein the test executive verifies that the reserved core or cores were reserved successfully for the ATE test program.

6. The computer system of claim 3, wherein the utility service is operative to release the reserved core or cores to general use following termination of the ATE test program.

7. The computer system of claim 1, wherein the utility service program maintains the time coherence of the ATE test program without interference from applications operating on cores other than the reserved core or cores.

8. The computer system of claim 1, wherein the temporal relationship of ATE test signals from the ATE is maintained during operation of the ATE application.

9. A computer based method for operating an automatic test equipment (ATE) computer system for testing externally located electronic devices wherein the ATE computer system includes a central processing unit having a plurality of separate core processing units, comprising the steps of:
initiating the operation of a utility service program at the startup of the computer system which acts as an intermediary between user applications and an operating system of the computer system wherein the utility service is responsive to an ATE execution engine in the ATE system to set an affinity for one or more processing cores for exclusive use of the ATE execution engine in the central processing unit, wherein testing of the external electronic circuit devices is accomplished by said one or more core processing units and wherein remaining core processing units from said plurality of separate core processing units are used for other computer operations;

reserving at least one core processing unit for the exclusive use of a test execution engine for execution of a test program present in the ATE such that the selected core is not otherwise used by the computer operating system during the test program; and testing externally located electronic devices with the automatic test equipment using the reserved core or cores.

10. The method of claim 9, wherein the temporal relationship of test signals from the ATE is uninterrupted by application processing in other core processing units.

11. The method of claim 9, including the step of verifying that the selected core was successfully reserved.

12. The method of claim 9, including the step of releasing the reserved core to common use following termination of the ATE test processing.

13. The method of claim 9, wherein the externally located electronic devices under test include electronic circuits, electronic circuit cards and electronic subsystems.

14. The method of claim 9, including the step of verifying that the utility service is installed and operating.

\* \* \* \* \*